United States Patent
Saruwatari et al.

(10) Patent No.: US 12,211,878 B2
(45) Date of Patent: *Jan. 28, 2025

(54) IMAGE SENSOR AND ELECTRONIC CAMERA

(71) Applicant: NIKON CORPORATION, Tokyo (JP)

(72) Inventors: Osamu Saruwatari, Yokohama (JP); Shutaro Kato, Kawasaki (JP); Ryoji Ando, Sagamihara (JP); Yojiro Tezuka, Yokohama (JP); Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 18/135,765

(22) Filed: Apr. 18, 2023

(65) Prior Publication Data

US 2023/0261025 A1 Aug. 17, 2023

Related U.S. Application Data

(62) Division of application No. 17/128,267, filed on Dec. 21, 2020, now Pat. No. 11,664,404, which is a
(Continued)

(30) Foreign Application Priority Data

Sep. 30, 2015 (JP) .................. 2015-195280

(51) Int. Cl.
*H01L 27/146* (2006.01)
*H04N 25/53* (2023.01)
(Continued)

(52) U.S. Cl.
CPC .... *H01L 27/14634* (2013.01); *H01L 27/1464* (2013.01); *H01L 27/14643* (2013.01);
(Continued)

(58) Field of Classification Search
CPC ........ H04N 5/353; H04N 5/361; H04N 5/369; H04N 5/3698; H04N 5/374; H04N 5/3741;
(Continued)

(56) References Cited

U.S. PATENT DOCUMENTS 6,008,486 A 12/1999 Stam et al.
8,854,517 B2 10/2014 Honda et al.
(Continued)

FOREIGN PATENT DOCUMENTS

EP 2230690 A2 9/2010
EP 3079356 A1 10/2016
(Continued)

OTHER PUBLICATIONS

Nov. 8, 2016 International Search Report issued in International Patent Application No. PCT/JP2016/078521.
(Continued)

*Primary Examiner* — Lin Ye
*Assistant Examiner* — Chriss S Yoder, III
(74) *Attorney, Agent, or Firm* — Oliff PLC

(57) ABSTRACT

An image sensor includes a first semiconductor substrate provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit, and a second semiconductor substrate provided with a supply unit for the pixel, the supply unit supplying the transfer unit with a transfer signal to transfer the electric charge from the photoelectric conversion unit to the accumulation unit.

18 Claims, 11 Drawing Sheets

Related U.S. Application Data division of application No. 15/765,046, filed as application No. PCT/JP2016/078521 on Sep. 27, 2016, now Pat. No. 10,944,924.

(51) Int. Cl.
  *H04N 25/70* (2023.01)
  *H04N 25/75* (2023.01)
  *H04N 25/766* (2023.01)
  *H04N 25/77* (2023.01)
  *H04N 25/63* (2023.01)

(52) U.S. Cl.
  CPC ............ *H04N 25/53* (2023.01); *H04N 25/70* (2023.01); *H04N 25/766* (2023.01); *H04N 25/77* (2023.01); *H01L 27/1469* (2013.01); *H04N 25/63* (2023.01); *H04N 25/75* (2023.01)

(58) Field of Classification Search
  CPC ...... H04N 5/3745; H04N 5/378; H04N 5/379; H04N 25/53; H04N 25/63; H04N 25/70; H04N 25/75; H04N 25/76; H04N 25/766; H04N 25/77; H01L 27/146; H01L 27/14601; H01L 27/14609; H01L 27/14632; H01L 27/14634; H01L 27/1464; H01L 27/14643; H01L 27/1469
  See application file for complete search history.

(56) References Cited

U.S. PATENT DOCUMENTS

| | | | |
|---|---|---|---|
| 9,918,030 | B2 | 3/2018 | Mabuchi |
| 2002/0109160 | A1 | 8/2002 | Mabuchi et al. |
| 2005/0024525 | A1 | 2/2005 | Yamaguchi et al. |
| 2006/0023109 | A1 | 2/2006 | Mabuchi et al. |
| 2007/0096238 | A1 | 5/2007 | Oike et al. |
| 2009/0033781 | A1 | 2/2009 | Okita et al. |
| 2010/0245647 | A1 | 9/2010 | Honda et al. |
| 2012/0286140 | A1 | 11/2012 | Itano et al. |
| 2013/0126710 | A1 | 5/2013 | Kondo |
| 2013/0277534 | A1 | 10/2013 | Watanabe |
| 2015/0015760 | A1 | 1/2015 | Tsunai |
| 2015/0077590 | A1 | 3/2015 | Kuriyama et al. |
| 2015/0163403 | A1 | 6/2015 | Wakabayashi |
| 2015/0189214 | A1* | 7/2015 | Kurose ............ H01L 27/14634 250/208.1 |
| 2016/0182842 | A1 | 6/2016 | Mabuchi |
| 2016/0300875 | A1 | 10/2016 | Won et al. |

FOREIGN PATENT DOCUMENTS

| | | | |
|---|---|---|---|
| JP | 2002-217397 | A | 8/2002 |
| JP | 2006-049361 | A | 2/2006 |
| JP | 2007-151069 | A | 6/2007 |
| JP | 2010-225927 | A | 10/2010 |
| JP | 2011-119946 | A | 6/2011 |
| JP | 2013-033852 | A | 2/2013 |
| JP | 2013-098598 | A | 5/2013 |
| JP | 2013-110449 | A | 6/2013 |
| JP | 2013-121093 | A | 6/2013 |
| JP | 2015-126043 | A | 7/2015 |
| KR | 101542881 | B1 | 8/2015 |
| TW | 200531539 | A | 9/2005 |
| TW | 201106691 | A | 2/2011 |
| TW | 201507472 | A | 2/2015 |
| WO | 2013/145765 | A1 | 10/2013 |
| WO | 2013/164915 | A1 | 11/2013 |
| WO | 2015/019836 | A1 | 2/2015 |
| WO | 2015/083674 | A1 | 6/2015 |

OTHER PUBLICATIONS

Jun. 28, 2017 Office Action issued in Taiwanese Patent Application No. 105131630.
Mar. 30, 2018 Office Action issued in Taiwanese Patent Application No. 105131630.
May 21, 2019 Office Action issued in Japanese Patent Application No. 2017-543449.
Aug. 22, 2019 Office Action issued in U.S. Appl. No. 15/765,046.
Jun. 25, 2019 Office Action issued in European Patent Application No. 16851567.4.
Kurino et al., "Intelligent Image Sensor Chip With Three Dimensional Structure". Electron Devices Meeting, p. 36.4.1-36.4.4, Dec. 5, 1999.
Jul. 26, 2019 Office Action issued in Korean Patent Application No. 10-2018-7008248.
Oct. 8, 2019 Office Action issued in Chinese Patent Application No. 201680056126.8.
Nov. 25, 2019 Office Action issued in Taiwanese Patent Application No. 107142346.
Mar. 18, 2020 Office Action issued in U.S. Appl. No. 15/765,046.
Sep. 21, 2020 Notice of Allowance issued in U.S. Appl. No. 15/765,046.
Nov. 10, 2020 Office Action issued in Taiwanese Patent Application No. 107142346.
Jun. 10, 2020 Advisory Action issued in U.S. Appl. No. 15/765,046.
Jan. 1, 2021 Office Action issued in Korean Patent Application No. 2020-7010126.
Jan. 12, 2021 Office Action issued in Japanese Patent Application No. 2019-229651.
Jul. 15, 2021 Office Action issued in European Patent Application No. 16 851 567.4.
Sep. 29, 2021, Restriction Requirement Issued in U.S. Appl. No. 17/128,267.
Feb. 3, 2022 Office Action Issued In U.S. Appl. No. 17/128,267.
Jun. 7, 2022 Office Action issued in Japanese Patent Application No. 2021-113775.
Computer-generated English translation of JP-A-2007-151069, (2007).
Jul. 25, 2022 Office Action issued in U.S. Appl. No. 17/128,267.
Jan. 26, 2023 Notice of Allowance issued in U.S. Appl. No. 17/128,267.
Jan. 31, 2023 Office Action issued in Japanese Patent Application No. 2021-113775.
Feb. 27, 2023 Corrected Notice of Allowability issued in U.S. Appl. No. 17/128,267.
Nov. 23, 2023 Result of Consultation issued in European Patent Application No. 16 851 567.4.
Jun. 2, 2023 Summons to attend oral proceedings pursuant to rule 115(1) EPC issued in European Patent Application No. 16851567.4.
Jul. 2, 2024 Office Action issued in Japanese Patent Application No. 2023-074498.

* cited by examiner

IMAGE SENSOR AND ELECTRONIC CAMERA

This is a divisional of U.S. patent application Ser. No. 17/128,267 filed Dec. 21, 2020, which in turn is a divisional of U.S. patent application Ser. No. 15/765,046 filed Mar. 30, 2018 (now U.S. Pat. No. 10,944,924), which is the U.S. National Stage of International Application No. PCT/JP2016/078251 filed Sep. 27, 2016, which claims priority from Japanese Application No. 2015-195280 filed in Japan on Sep. 30, 2015. The disclosure of each of the above-identified prior applications is incorporated by reference herein in its entirety.

TECHNICAL FIELD

The present invention relates to an image sensor and an electronic camera.

BACKGROUND ART

An image sensor known in the art has stacked chips, one of the chips having pixels formed thereon and the other of the chips having a pixel driving circuit formed thereon for driving the pixels (e.g., PTL1). The conventional image sensor must be provided with two transfer pulse power supplies for each pixel in order to individually control exposure amounts for the pixels, which may present a problem.

CITATION LIST

Patent Literature

PTL1: Japanese Laid-Open Patent Publication No. 2010-225927

SUMMARY OF INVENTION

An image sensor according to the 1st aspect of the present invention comprises: a first semiconductor substrate provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit, and a second semiconductor substrate provided with a supply unit for the pixel, the supply unit supplying the transfer unit with a transfer signal to transfer the electric charge from the photoelectric conversion unit to the accumulation unit.

An image sensor according to the 2nd aspect of the present invention comprises: a photoelectric conversion unit that photoelectrically converts incident light, a transfer unit that transfers an electric charge photoelectrically converted by the photoelectric conversion unit to an accumulation unit in response to a transfer signal, a transfer signal supply unit that supplies the transfer unit with the transfer signal, a first reset unit that resets the electric charge accumulated in the accumulation unit in response to a reset signal, a reset signal supply unit that supplies the first reset unit with the reset signal, a first semiconductor substrate provided with the photoelectric conversion unit, the transfer unit, and the first reset unit, and a second semiconductor substrate provided with the reset signal supply unit arranged in a first diffusion layer and the transfer signal supply unit arranged in a second diffusion layer having a polarity different from that of the first diffusion layer.

An electronic camera according to the 3rd aspect of the present invention comprises: the image sensor according to the 1st aspect or 2nd aspect.

DESCRIPTION OF EMBODIMENTS

First Embodiment

Figure 1:
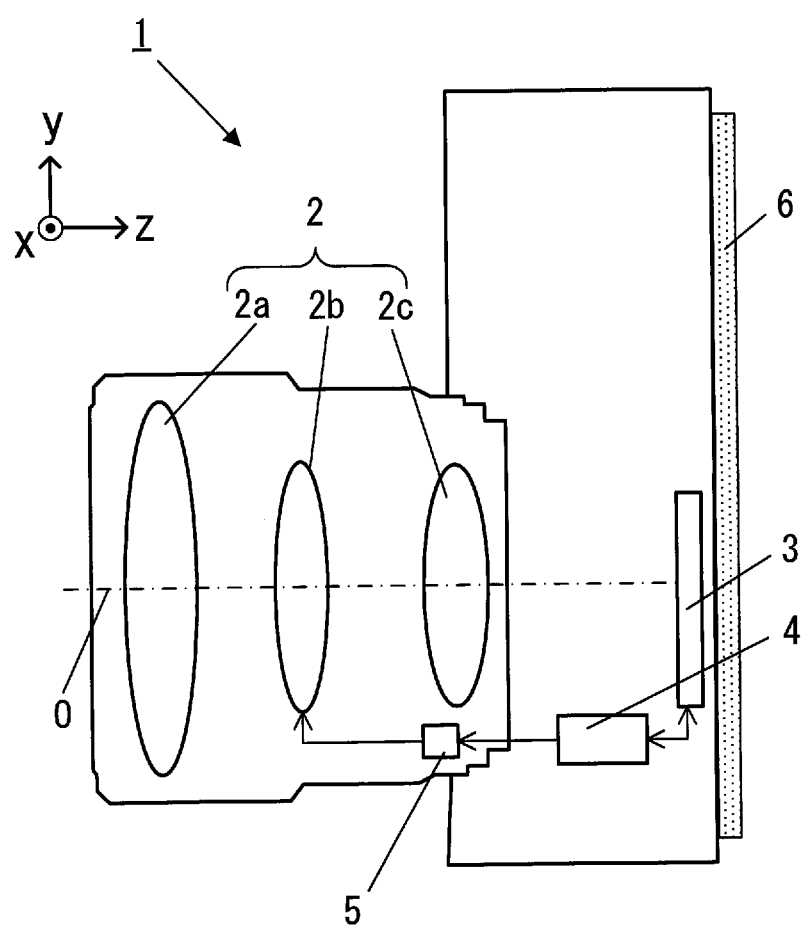
FIG. 1 is a cross-sectional view schematically illustrating a configuration of an image-capturing apparatus.

FIG. 1 is a cross-sectional view schematically illustrating a configuration of an image-capturing apparatus including an image sensor according to a first embodiment. The image-capturing apparatus 1 includes an image-capturing optical system 2, an image sensor 3, a control unit 4, a lens driving unit 5, and a display unit 6.

The image-capturing optical system 2 forms an object image on an image-capturing plane of the image sensor 3. The image-capturing optical system 2 includes a lens 2a, a focusing lens 2b, and a lens 2c. The focusing lens 2b is a lens for adjusting a focal point of the image-capturing optical system 2. The focusing lens 2b can be driven in an optical axis O direction.

The lens driving unit 5 has an actuator (not shown). Using the actuator, the lens driving unit 5 drives the focusing lens 2b in the optical axis O direction by a desired amount. The image sensor 3 captures the object image to output an image signal. The control unit 4 controls the image sensor 3 and other components. The control unit 4 performs image processing or other processing on an image signal outputted by the image sensor 3, and then records the processed image signal in a recording medium (not shown) or displays an image on the display unit 6. The display unit 6 is a display device having a display member such as a liquid crystal panel.

Figure 2:
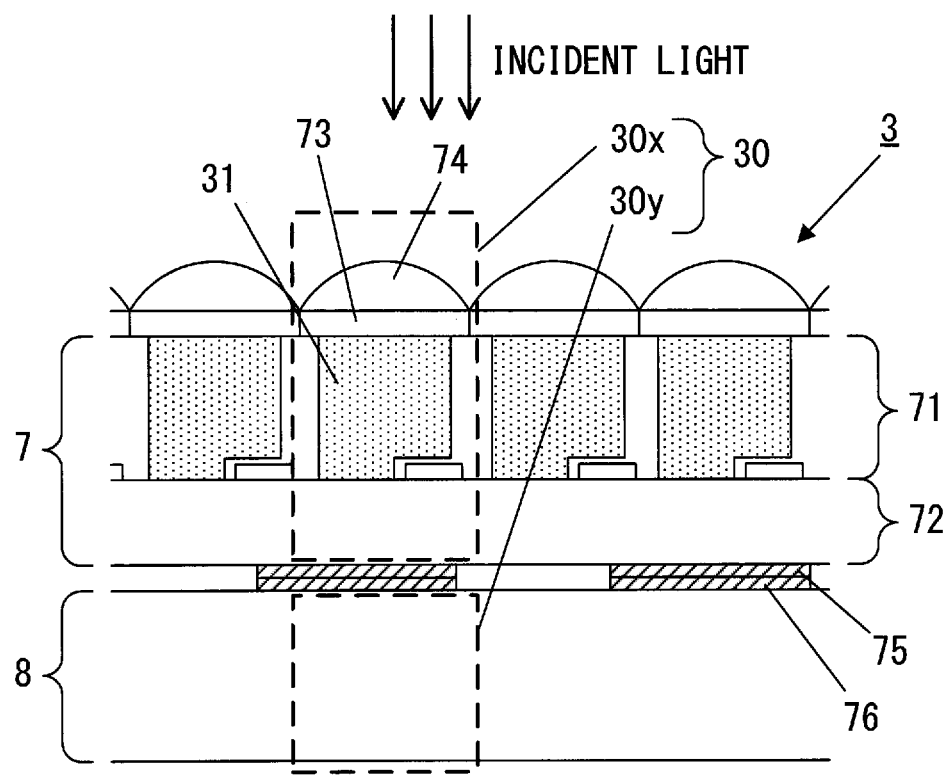
FIG. 2 is a cross-sectional view of an image sensor.

FIG. 2 is a cross-sectional view of the image sensor 3. FIG. 2 illustrates only a part of the entire image sensor 3 in cross section. The image sensor 3 is a so-called backside illumination image sensor. The image sensor 3 photoelectrically converts incident light that is incident from above in the figure. The image sensor 3 includes a first semiconductor substrate 7 and a second semiconductor substrate 8.

The first semiconductor substrate 7 includes at least a PD layer 71 and a wiring layer 72. The PD layer 71 is arranged on a back surface side of the wiring layer 72. A plurality of photodiodes 31, which are pinned (embedded) photodiodes, are two-dimensionally arranged in the PD layer 71. A surface of the PD layer 71 on the wiring layer 72 side (i.e., a surface opposite to the incident light side) therefore has a conductivity type opposite to that of the PD layer 71. For example, if the PD layer 71 is an N-type semiconductor layer, a P-type semiconductor layer having a high concentration and a small thickness is arranged on the surface of the PD layer 71 on the wiring layer 72 side. A ground voltage (GND) is applied to the first semiconductor substrate 7 as a substrate voltage. The second semiconductor substrate 8 has a variety of circuits arranged thereon at least for reading signals from the photodiode 31. Specifically, a part of a pixel driving unit 307 described later (i.e., a transfer signal supply unit 307a and a second reset signal supply unit 307c that handle negative voltage) is arranged in the second semiconductor substrate 8. A voltage VTxL (described later) is applied to the second semiconductor substrate 8 as a substrate voltage.

A plurality of color filters 73, each corresponding to its individual photodiode among a plurality of the photodiodes 31, are provided on the incident light side of the PD layer 71. Different types of color filters 73 are available, which transmit different wavelength ranges corresponding to red (R), green (G), and blue (B), for example. Three types of color filters 73 corresponding to red (R), green (G), and blue (B), for example, are here arranged in a Bayer array.

A plurality of microlenses 74, each corresponding to its individual color filter among a plurality of the color filters 73, are provided on the incident light side of the color filter 73. The microlens 74 converges the incident light toward the corresponding photodiode 31. After having passed through the microlens 74, the incident light is filtered by the color filter 73 to transmit only a part of the wavelength range of the incident light. The filtered light is then incident on the photodiode 31. The photodiode 31 photoelectrically converts the incident light to generate an electric charge.

A plurality of bumps 75 are arranged on a surface of the wiring layer 72. A plurality of bumps 76 corresponding to a plurality of the bumps 75 are arranged on a surface of the second semiconductor substrate 8 opposing to the wiring layer 72. A plurality of the bumps 75 and a plurality of the bumps 76 are bonded together. The first semiconductor substrate 7 and the second semiconductor substrate 8 are electrically connected via a plurality of the bumps 75 and a plurality of the bumps 76.

The image sensor 3 has a plurality of pixels 30. Details thereof will be described later. One pixel 30 includes a first pixel 30x provided in the first semiconductor substrate 7 and a second pixel 30y provided in the second semiconductor substrate 8. One first pixel 30x includes one microlens 74, one color filter 73, one photodiode 31, and other components. The first pixel 30x additionally includes a variety of circuits (described later) provided in the first semiconductor substrate 7. The second pixel 30y includes a variety of circuits (described later) provided in the second semiconductor substrate 8.

Figure 3:
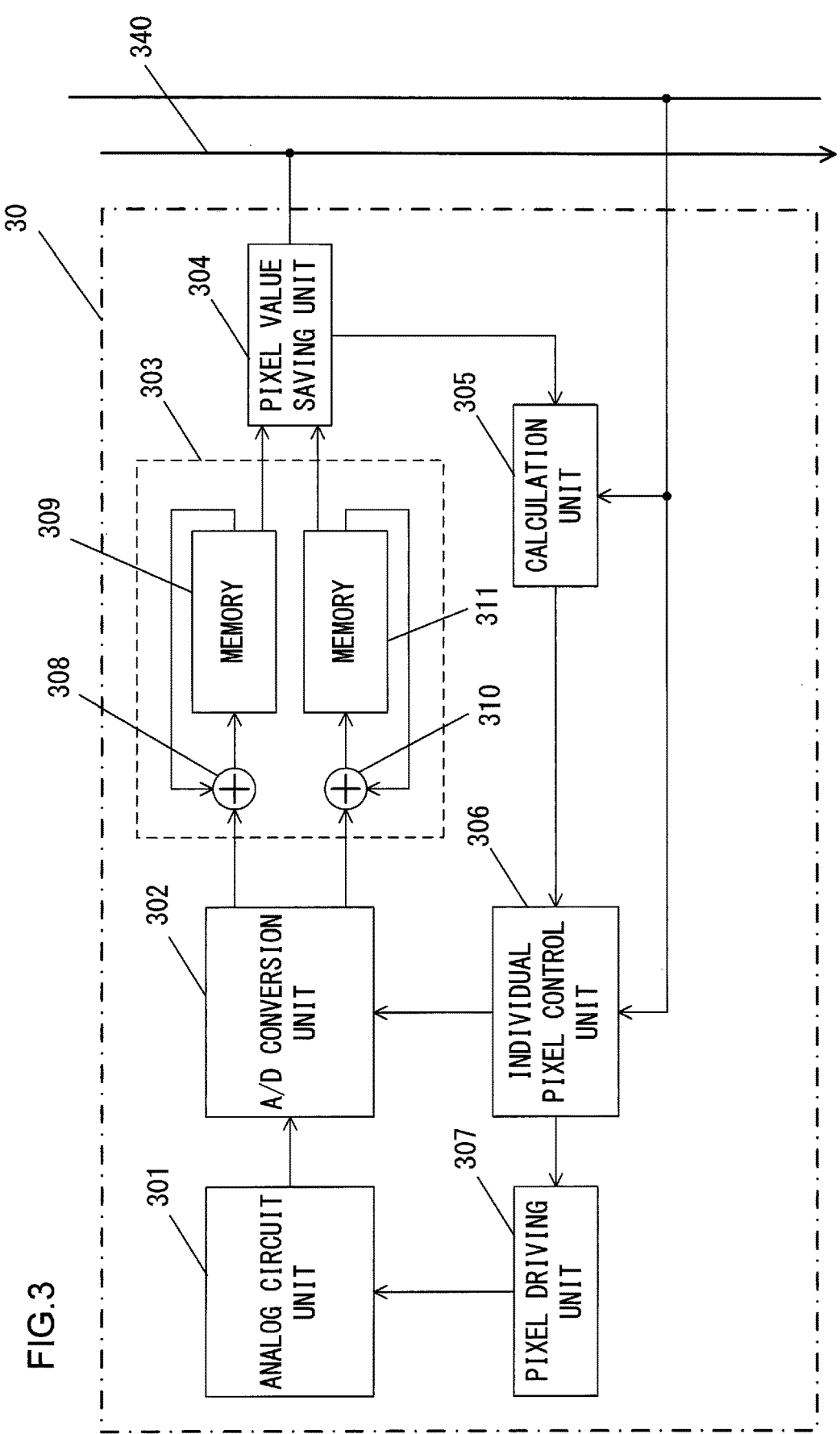
FIG. 3 is a block diagram schematically illustrating a configuration of a pixel.

FIG. 3 is a block diagram schematically illustrating a configuration of the pixel 30. The pixel 30 includes an analog circuit unit 301, an A/D conversion unit 302, a sampling unit 303, a pixel value saving unit 304, a pixel driving unit 307, an individual pixel control unit 306, and a calculation unit 305.

The analog circuit unit 301 photoelectrically converts incident light to output the resulting signal as an analog signal to the A/D conversion unit 302. The A/D conversion unit 302 samples the analog signal outputted by the analog circuit unit 301 to output a digital signal multiplied by a predetermined gain. The A/D conversion unit 302 repeatedly samples a pixel reset signal and a pixel signal and individually outputs a sampling result of the pixel reset signal and a sampling result of the pixel signal as digital signals.

The sampling unit 303 calculates and saves an integral value of the sampling result of the pixel reset signal and the sampling result of the pixel signal. The sampling unit 303 includes a first adder 308 and a first memory 309 for the pixel reset signal, and a second adder 310 and a second memory 311 for the pixel signal.

The sampling unit 303 adds the sampling result of the pixel reset signal outputted by the A/D conversion unit 302 and the integral value of previous sampling results saved in the first memory 309, by means of the first adder 308. The sampling unit 303 stores the resulting sum in the first memory 309. The sampling unit 303 updates the value stored in the first memory 309 every time a sampling result of the pixel reset signal is outputted by the A/D conversion unit 302.

The sampling unit 303 adds the sampling result of the pixel signal outputted by the A/D conversion unit 302 and the integral value of previous sampling results saved in the second memory 311, by means of the second adder 310. The sampling unit 303 stores the resulting sum in the second memory 311. The sampling unit 303 updates the value stored in the second memory 311 every time a sampling result of the pixel signal is outputted by the A/D conversion unit 302.

In this way, the A/D conversion unit 302 repeatedly samples the pixel reset signal and the pixel signal and the sampling unit 303 executes a process of integrating the sampling results. This process is a process known as a correlated multiple sampling.

Once a predetermined number of samplings, which has been determined by the individual pixel control unit 306, has been completed, the sampling unit 303 outputs a digital value to the pixel value saving unit 304, the digital value being based on the value stored in the first memory 309 and the value stored in the second memory 311. The pixel value saving unit 304 stores the digital value as a photoelectric conversion result in the pixel 30. The pixel value saving unit 304 is connected to a signal line 340. The digital value stored in the pixel value saving unit 304 is externally readable via the signal line 340.

The calculation unit 305 calculates the number of repetitions, an exposure time, a gain, and other parameters in the correlated multiple sampling process, based on an externally determined exposure time and the last photoelectric conversion result saved in the pixel value saving unit 304. The individual pixel control unit 306 outputs the number of repetitions and the gain calculated by the calculation unit 305 to the A/D conversion unit 302. The individual pixel control unit 306 outputs the exposure time and the gain calculated by the calculation unit 305 to the pixel driving unit 307. The pixel driving unit 307 outputs a variety of signals (described later) to the analog circuit unit 301. The signals drive the elements of the analog circuit unit 301.

Figure 4:
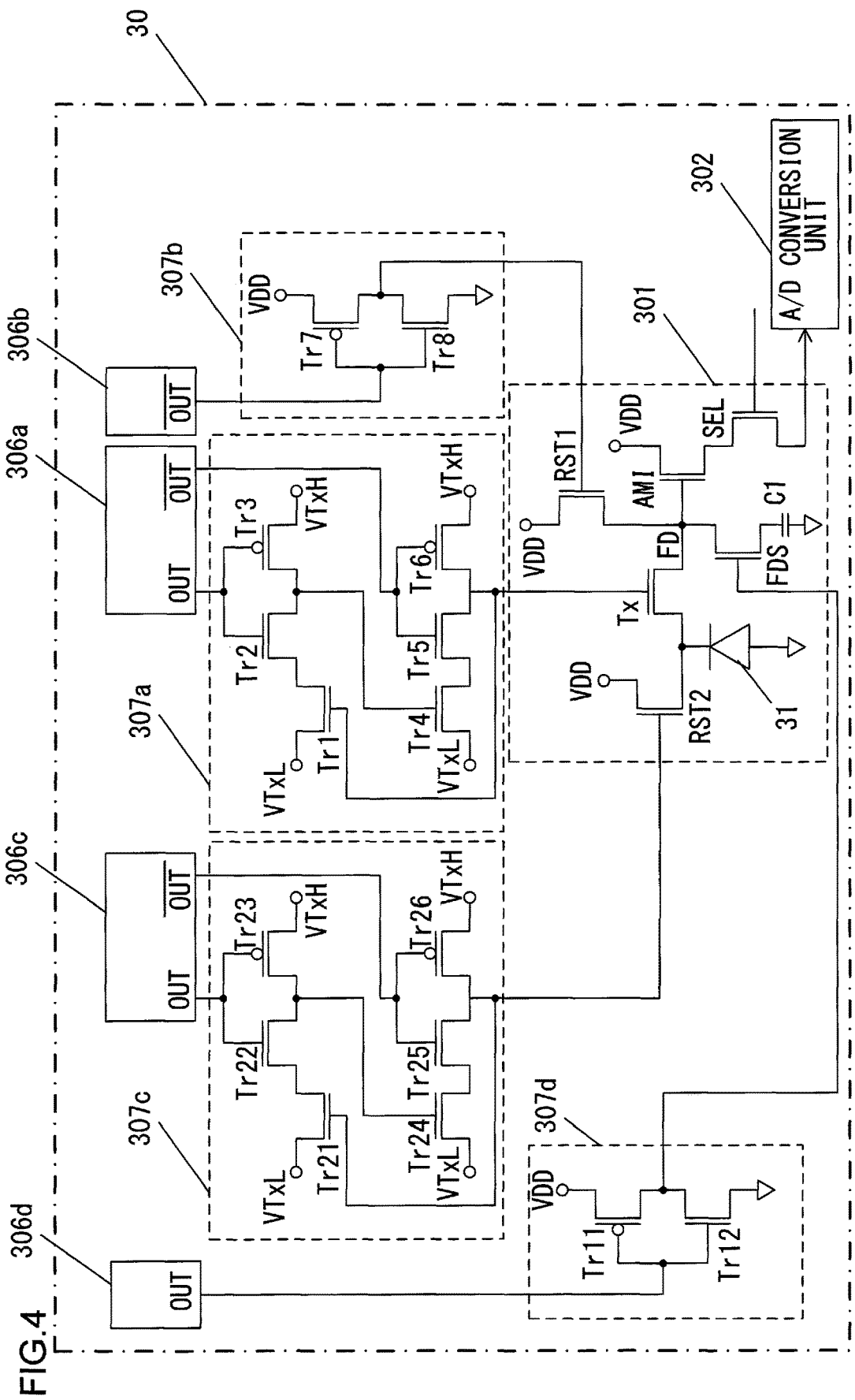
FIG. 4 is a circuit diagram of an analog circuit unit and a pixel driving unit.

FIG. 4 is a circuit diagram of the analog circuit unit 301, the individual pixel control unit 306, and the pixel driving unit 307. For the sake of convenience, FIG. 4 illustrates only parts of the individual pixel control unit 306 and the pixel driving unit 307. The parts of the individual pixel control unit 306 are denoted by reference numerals 306a, 306b, and so on and the parts of the pixel driving unit 307 are denoted by reference numerals 307a, 307b, and so on.

The analog circuit unit 301 includes a photodiode 31, a transfer transistor Tx, a floating diffusion FD, a first reset transistor RST1, a second reset transistor RST2, an amplification transistor AMI, a selection transistor SEL, a capacitance expansion transistor FDS, and a capacitor C1.

The photodiode 31 is a photoelectric conversion unit that photoelectrically converts incident light to generate an amount of electric charge depending on a light amount of the incident light. The transfer transistor Tx is a transfer unit that transfers the electric charge generated by the photodiode 31 to the floating diffusion FD in response to a transfer signal supplied from a transfer signal supply unit 307a (described later). The floating diffusion FD is an accumulation unit that accumulates the electric charge transferred by the transfer transistor Tx. The amplification transistor AMI outputs a signal depending on an amount of the electric charge accumulated in the floating diffusion FD. When the selection transistor SEL is on, the signal outputted by the amplification transistor AMI is inputted to the A/D conversion unit 302.

The analog circuit unit 301 includes two reset transistors: a first reset transistor RST1 and a second reset transistor RST2. When the floating diffusion FD is reset, the first reset transistor RST1 is supplied with a first reset signal from a first reset signal supply unit 307b (described later). The first reset signal supply unit 307b (described later) supplies a signal representing the voltage VDD as the first reset signal. The first reset transistor RST1 resets the floating diffusion FD in response to the first reset signal. When the photodiode 31 is reset, the second reset transistor RST2 is supplied with a second reset signal from a second reset signal supply unit 307c (described later). The second reset signal supply unit 307c (described later) supplies a signal representing the voltage VDD as the second reset signal. The second reset transistor RST2 resets the photodiode 31 in response to the second reset signal.

The capacitance expansion transistor FDS switches a connection between the floating diffusion FD and the capacitor C1 in response to a capacitance expansion signal supplied from a capacitance expansion signal supply unit 307d (described later). For example, if an incident light amount to the photodiode 31 is large and the floating diffusion FD could be saturated, the capacitance expansion transistor FDS is turned on to connect the floating diffusion FD and the capacitor C1. This substantially increases the capacitance of the floating diffusion FD by an amount equal to the capacitance of the capacitor C1, which allows the floating diffusion FD to handle a larger light amount.

The first reset signal supply unit 307b is a CMOS circuit including a pMOS transistor Tr7 and an nMOS transistor Tr8. Based on an output signal of a first reset control unit 306b, the first reset signal supply unit 307b supplies a gate of the first reset transistor RST1 with either the voltage VDD or the voltage GND as the first reset signal. As described above, the first reset control unit 306b is a part of the individual pixel control unit 306 and the first reset signal supply unit 307b is a part of the pixel driving unit 307. It should be noted that, for an overdrive, the first reset control unit 306b supplies the gate of the first reset transistor RST1 with a voltage VRST1H higher than the voltage VDD, instead of the voltage VDD.

The capacity expansion signal supply unit 307d is a CMOS circuit including a pMOS transistor Tr11 and an nMOS transistor Tr12. Based on an output signal of a capacitance expansion control unit 306d, the capacitance expansion signal supply unit 307d supplies a gate of the capacitance expansion transistor FDS with either the voltage VDD or the voltage GND as the capacitance expansion signal. As described above, the capacity expansion control unit 306d is a part of the individual pixel control unit 306 and the capacity expansion signal supply unit 307d is a part of the pixel driving unit 307. It should be noted that, for an overdrive, the capacity expansion signal supply unit 307d supplies the gate of the capacity expansion transistor FDS with a voltage VFDSH higher than the voltage VDD, instead of the voltage VDD.

The transfer signal supply unit 307a includes an nMOS transistor Tr1, an nMOS transistor Tr2, a pMOS transistor Tr3, an nMOS transistor Tr4, an nMOS transistor Tr5, and a pMOS transistor Tr6.

The nMOS transistor Tr2 and the pMOS transistor Tr3 constitute a CMOS circuit. A predetermined power supply applies a voltage VTxH to a source of the pMOS transistor Tr3. A transfer control unit 306a supplies gates of the nMOS transistor Tr2 and the pMOS transistor Tr3 with a transfer control signal. A source of the nMOS transistor Tr2 is connected to a drain of the nMOS transistor Tr1. A predetermined power supply applies a voltage VTxL to a source of the nMOS transistor Tr1. The voltage VTxH is higher than the ground voltage that is the substrate voltage of the first semiconductor substrate 7 (i.e., the voltage VTxH is a positive voltage), while the voltage VTxL is lower than the ground voltage that is the substrate voltage of the first semiconductor substrate 7 (i.e., the voltage VTxL is a negative voltage).

The nMOS transistor Tr5 and the pMOS transistor Tr6 constitute a CMOS circuit. A predetermined power supply applies a voltage VTxH to a source of the pMOS transistor Tr6. The transfer control unit 306a supplies gates of the nMOS transistor Tr5 and the pMOS transistor Tr6 with a signal having high and low levels that are inverted with respect to those of the transfer control signal. A source of the nMOS transistor Tr5 is connected to a drain of the nMOS transistor Tr4. A predetermined power supply applies a voltage VTxL to a source of the nMOS transistor Tr4.

A gate of the nMOS transistor Tr4 is connected to drains of the nMOS transistor Tr2 and the pMOS transistor Tr3. A gate of the nMOS transistor Tr is connected to drains of the nMOS transistor Tr5 and the pMOS transistor Tr6. The transfer transistor Tx is supplied with a voltage from the drains of the nMOS transistor Tr5 and the pMOS transistor Tr6 as the transfer signal.

In other words, the pMOS transistor Tr6 functions as a first power supply unit that supplies the gate of the transfer transistor Tx with the voltage VTxH higher than the substrate voltage of the first semiconductor substrate 7. The nMOS transistor Tr4 and the nMOS transistor Tr5 function as a second power supply unit that supplies the gate of the transfer transistor Tx with the voltage VTxL lower than the substrate voltage of the first semiconductor substrate 7.

The transfer signal supply unit 307a includes not only the nMOS transistor Tr5 and the pMOS transistor Tr6 constituting the CMOS, but also the nMOS transistor Tr, the nMOS transistor Tr2, the pMOS transistor Tr3, and the nMOS transistor Tr4. The reason for this will be explained below.

The inverted transfer control signal supplied by the unit 306a is a signal having a voltage VDD as its high level and a ground voltage GND as its low level. The nMOS transistor Tr5 must be turned off when a low level signal (i.e., the ground voltage) is applied to the gate thereof.

Given a circuit with the nMOS transistor Tr4 omitted and the voltage VTxL applied to the source of the nMOS transistor Tr5, the nMOS transistor Tr5 is turned off when a gate-source voltage VGS is lower than a gate threshold voltage Vth. The gate-source voltage VGS becomes larger than zero by an amount equal to VTxL (VGS=0−VTxL) when the low level signal (i.e., the ground voltage) is applied to the gate of the nMOS transistor Tr5. In this circuit, the nMOS transistor Tr5 is therefore not completely turned off for the gate threshold voltage Vth smaller than −VTxL, even if the gate of the nMOS transistor Tr5 is supplied with the low level signal. This makes the circuit unstable. The circuit used in the present embodiment allows the nMOS transistor Tr4 to shut off the supply of the voltage VTxL to the source of the nMOS transistor Tr5, even if the nMOS transistor Tr5 is not completely turned off. The above-described problem concerning the gate threshold voltage Vth can thus be avoided. It should be noted that the nMOS transistor Tr, the nMOS transistor Tr2, the pMOS transistor Tr3, and the nMOS transistor Tr4 may be omitted as long as the gate threshold voltage Vth of the nMOS transistor Tr5 can be sufficiently increased.

The transfer signal supply unit 307a configured in the above-described manner supplies the gate of the transfer transistor Tx with either the voltage VTxH or the voltage VTxL as the transfer signal, based on the output signal of the transfer control unit 306a. As described above, the transfer control unit 306a is a part of the individual pixel control unit 306 and the transfer signal supply unit 307a is a part of the pixel driving unit 307. It should be noted that the voltage VTxL lower than the substrate voltage of the first semiconductor substrate 7 is applied to the gate of the transfer transistor Tx in order to prevent the electric charge from being transferred from the photodiode 31 to the floating diffusion FD when the transfer transistor Tx is off.

The second reset signal supply unit 307c includes an nMOS transistor Tr21, an nMOS transistor Tr22, a pMOS transistor Tr23, an nMOS transistor Tr24, an nMOS transistor Tr25, and a pMOS transistor Tr26. Based on an output signal of a second reset control unit 306c, the second reset signal supply unit 307c supplies a gate of the second reset transistor RST2 with either the voltage VTxH or the voltage VTxL as the second reset signal. The configuration of the second reset signal supply unit 307c is the same as that of the transfer signal supply unit 307a and the description thereof will thus be omitted. As described above, the second reset control unit 306c is a part of the individual pixel control unit 306 and the second reset signal supply unit 307c is a part of the pixel driving unit 307.

Figure 5:
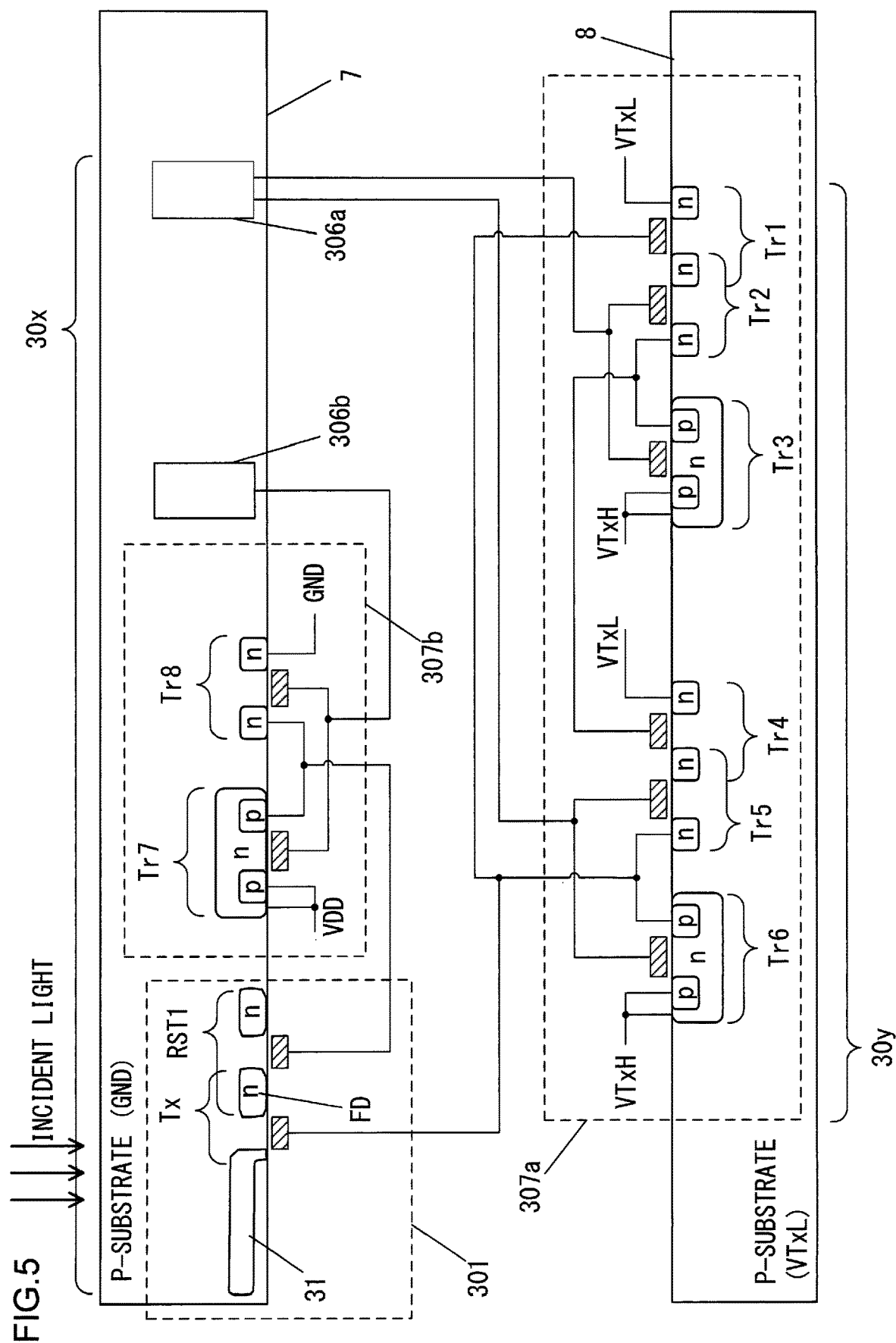
FIG. 5 is a view schematically illustrating a well structure of a first semiconductor substrate and a second semiconductor substrate.

FIG. 5 is a view schematically illustrating a well structure of the first semiconductor substrate 7 and the second semiconductor substrate 8. Incident light is incident onto the first semiconductor substrate 7 from above in the figure. The first semiconductor substrate 7 is a P-type semiconductor substrate. The substrate voltage of the first semiconductor substrate 7 is set to the ground voltage GND. The second semiconductor substrate 8 is a P-type semiconductor substrate. The substrate voltage of the second semiconductor substrate 8 is set to a voltage corresponding to VTxL.

Among the units illustrated in FIG. 4, the analog circuit unit 301, the transfer control unit 306a, the first reset control unit 306b, and the first reset signal supply unit 307b are arranged in the first semiconductor substrate 7. Among the units illustrated in FIG. 4, a transfer signal supply unit 307a is arranged in the second semiconductor substrate 8. Although not illustrated in FIG. 5, other components are arranged in the first semiconductor substrate 7.

Figure 6:
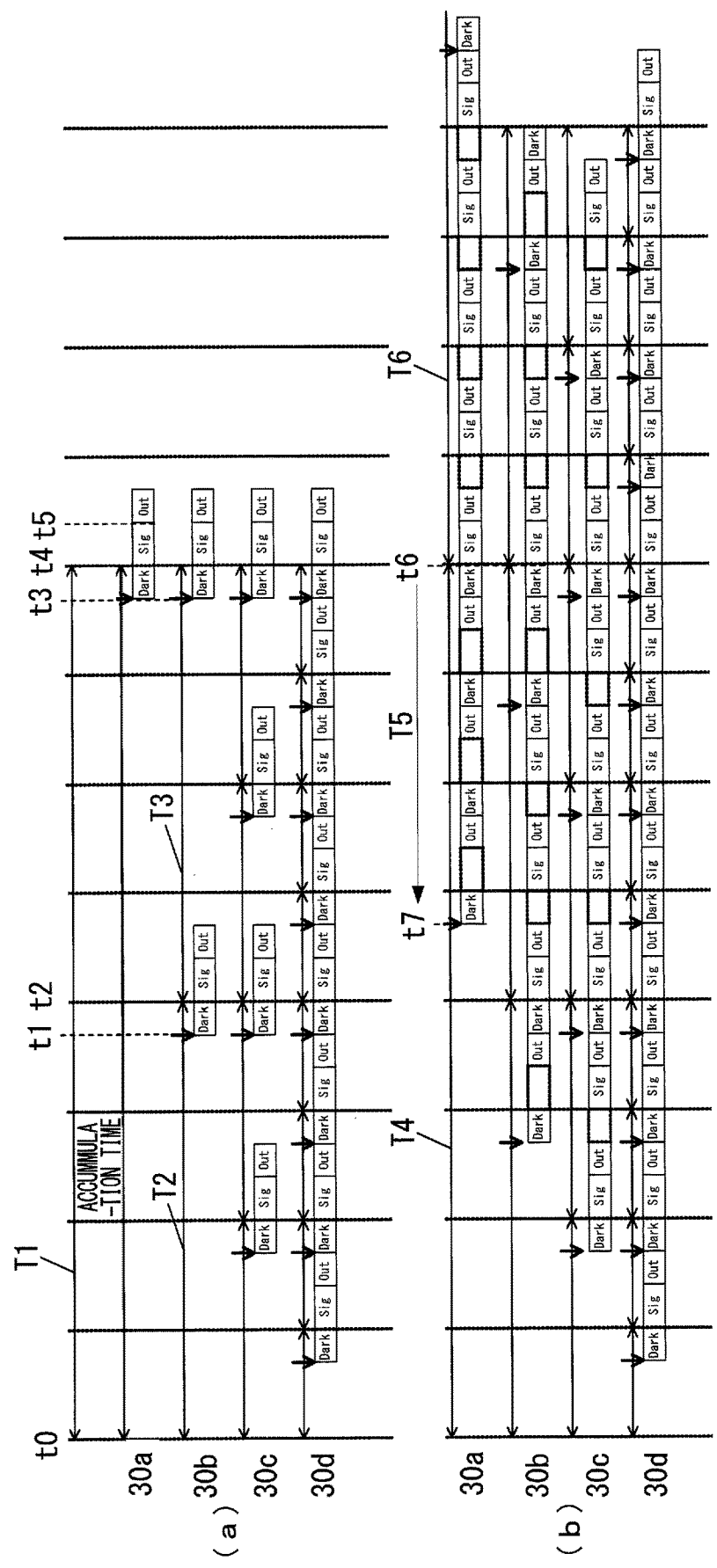
FIG. 6 is a timing chart illustrating an image-capturing sequence using the image sensor.

FIG. 6 is a timing chart illustrating an image-capturing sequence using the image sensor 3. The image sensor 3 can selectively perform multiple exposure and the correlated multiple sampling. First, a multiple exposure control will be described with reference to FIG. 6(a).

FIG. 6(a) is a timing chart in the multiple exposure for each pixel 30. The horizontal axis in FIG. 6(a) denotes time, and time proceeds to right. Rectangles marked as "Dark" in FIG. 6(a) indicate timings at which the A/D conversion unit 302 samples the pixel reset signals. Rectangles marked as "Sig" in FIG. 6(a) indicate timings at which the A/D conversion unit 302 samples the pixel signals. Rectangles marked as "Out" in FIG. 6(a) indicate timings at which the pixel value saving unit 304 outputs the digital value (the photoelectric conversion result) stored therein to peripheral circuits via the signal line 340. In FIG. 6(a), in performing the multiple exposure, the pixels 30 are classified into four pixels 30a to 30d depending on an amount of the incident light.

An operation of resetting the photodiode 31 and the floating diffusion FD at a start time t0 of an exposure period T1 is the same for all pixels 30. In the pixel 30a that receives an extremely small amount of incident light, the floating diffusion FD is then reset at a time t3 to sample the pixel reset signal. The time t3 is a time obtained by subtracting a time required for resetting the floating diffusion FD and sampling the pixel reset signal from an end time t4 of the exposure period T1. At the end time t4 of the exposure period T1, the electric charge that has been generated in a period from the time t0 to the time t4 and accumulated in the photodiode 31 is transferred to the floating diffusion FD to sample the pixel signal. Then, at a time t5, the photoelectric conversion result is stored in the pixel value saving unit 304.

In the pixel 30b that receives a slightly small amount of incident light, the externally determined exposure period T1 is equally divided into two periods T2 and T3 to perform the above-described operation twice. Specifically, at the times t1 and t3, the floating diffusion FD is reset to sample the pixel reset signal. The time t1 is a time obtained by subtracting a time required for resetting the floating diffusion FD and sampling the pixel reset signal from an end time t2 of the period T2. Then, at the time t2, the electric charge accumulated in the photodiode 31 is transferred to the floating diffusion FD to sample the pixel signal. The operation during a period from the time 3 to the time t5 is the same as in the case of the pixel 30a.

In the pixel 30c that receives a slightly large amount of incident light, the externally determined exposure period T1 is equally divided into four periods to perform the above-described operation four times. In the pixel 30d that receives an extremely large amount of incident light, the externally determined exposure period T1 is equally divided into eight periods to perform the above-described operation eight times.

In this way, the multiple exposure control enables the exposure time to individually vary for the pixels 30 receiving a large amount of incident light and the pixels 30 receiving a small amount of incident light in order to capture an image. Subdividing the exposure time and repeating the image-capturing allow a dynamic range to be extended, even if the incident light amount is so large that the floating diffusion FD would be saturated in a common image-capturing.

Next, the correlated multiplex sampling control will be described with reference to FIG. 6(b). FIG. 6(b) is a timing chart in the correlation multiple sampling control for each pixel 30. The horizontal axis in FIG. 6(b) denotes time, and time proceeds to right. Rectangles marked as "Dark" in FIG. 6(b) indicate timings at which the A/D conversion unit 302 samples the pixel reset signals. Rectangles marked as "Sig" in FIG. 6(b) indicate timings at which the A/D conversion unit 302 samples the pixel signals. Rectangles marked as "Out" in FIG. 6(b) indicate timings at which the A/D conversion unit 302 outputs the sampling results to the sampling unit 303. In FIG. 6(b), in performing the correlation multiple sampling, the pixels 30 are classified into four pixels 30a to 30d depending on an amount of the incident light.

The pixel 30a has the longest exposure time and the pixel 30d has the shortest exposure time. In the correlated multiple sampling control, the floating diffusion FD is reset at an earlier time as the pixel 30 has a longer exposure time. It thus takes a longer time until the pixel signal is sampled after resetting the floating diffusion FD, as the pixel 30 has a longer exposure time. During that period, the pixel reset signal is repeatedly sampled.

For example, in FIG. 6(b), the pixel 30a has the longest exposure time. The floating diffusion FD is reset at a time t7 that is earlier than an end time t6 of an exposure time T4 of the pixel 30a by a period T5. As a result, the pixel reset signal is sampled four times before the time t6. The pixel signal is then repeatedly sampled during a period from the end of the exposure time T4 to the end of the next exposure time T6.

A long exposure time translates into a small amount of the incident light and thus a large influence of noises on the pixel signal caused by the amplification transistor AMI, the selection transistor SEL, and the A/D conversion unit 302. In other words, the number of samplings of the pixel reset signal and the pixel signal to be performed is larger for the pixel 30 influenced to a greater extent by the noises described above, which enables a more sensitive image-capturing to be performed.

The image sensor 3 performs the above-described operations on all the pixels 30 in parallel. In other words, the pixels 30 perform in parallel the operations from the photoelectric conversion in the photodiode 31 to the storage of the digital value into the pixel value saving unit 304. The image-capturing results are sequentially read out from the pixel value saving unit 304 from one pixel 30 to another.

In this way, the image sensor 3 in the present embodiment can control the exposure time for each pixel. In order to control the exposure time for each pixel, the timing of turning on and off the transfer transistor Tx must be controlled for each pixel. In other words, the voltage (in the present embodiment, the voltage VTxH and the voltage VTxL) to be supplied to the gate of the transfer transistor Tx must be controlled for each pixel. Accordingly, the first power supply unit for supplying the voltage VTxH and the second power supply unit for supplying the voltage VTxL must be provided for each pixel. Since the voltage handled by the first semiconductor substrate 7 is different from the voltage VTxH and the voltage VTxL, the first power source unit and the second power source unit would occupy a large area if they would be provided in the pixel 30. The first power supply unit particularly requires a triple well structure to avoid a forward bias with respect to the substrate, since the first power supply unit handles the voltage VTxL lower than the substrate voltage. The first power supply unit therefore requires a particularly large area. As a result, an area occupied by the photodiode 31 in the pixel 30 would substantially be reduced. This causes a substantially reduced fill factor of the photodiode 31, which can make miniaturization of the image sensor difficult. In the present embodiment, providing the first power supply unit and the second power supply unit in the second semiconductor substrate 8 allows the exposure time to be controlled for each pixel, without providing the first power supply unit and the second power supply unit in the vicinity of the photodiode 31 of the first semiconductor substrate 7, i.e., without decreasing the fill factor of the photodiode 31.

According to the above-described embodiment, the following operational advantages can be obtained.

(1) The first semiconductor substrate 7 is provided with the photodiode 31 that photoelectrically converts incident light and the transfer transistor Tx that transfers the electric charge generated by the photodiode 31 to the floating diffusion FD in response to the transfer signal. However, the transfer signal supply unit 307a that supplies the gate electrode of the transfer transistor TX with the transfer signal is not arranged in the first semiconductor substrate 7. The second semiconductor substrate 8 is provided with the transfer signal supply unit 307a that supplies the gate of the transfer transistor Tx with either the voltage VTxL lower than the ground voltage or the voltage VTxH higher than the ground voltage as the transfer signal. This enables the transfer transistor Tx to be reliably turned off and thus prevents an increase in the dark current. Further, since no circuit handling a negative power supply is provided in the first semiconductor substrate 7, there is no need to provide a diffusion layer or another layer that handles the negative power supply in the first semiconductor substrate 7, which can improve the fill factor of the photodiode 31. The same effect can be obtained also for the second reset transistor RST2.

(2) The first semiconductor substrate 7 includes a plurality of the photodiodes 31, a plurality of the floating diffusions FD, and a plurality of the transfer transistors Tx. The second semiconductor substrate 8 includes a plurality of the transfer signal supply units 307a. Some of a plurality of the transfer signal supply units 307a transfer the electric charge generated by the photodiodes 31 during the first period to the floating diffusions FD. Others of the transfer signal supply units 307a transfer the electric charge generated by the photodiodes 31 during the second period to the floating diffusions FD, the second period having a length different from that of the first period. This enables the exposure time to individually vary for different pixels 30, which results in an extended dynamic range of the image sensor 3.

(3) The image-capturing sequence is set so that the end time of the first period is the same as the end time of the second period. This can achieve a simple image-capturing control.

(4) While the substrate voltage of the first semiconductor substrate 7 is set to the ground voltage, the substrate voltage of the second semiconductor substrate 8 is set to a voltage corresponding to the voltage VTxL that is different from the ground voltage. In this way, a variation range of the signal voltage of the transfer signal supplied to the gate of the transfer transistor Tx can be set to a voltage that is different from the other drive signals, without any additional diffusion layers. The same effect can be obtained also for the second reset transistor RST2.

(5) The voltage VTxL, which is one of the voltages (i.e., the voltage VTxL and the voltage VTxH) of the transfer signal, is a voltage based on the substrate voltage of the second semiconductor substrate 8. In this way, a variation range of the signal voltage of the transfer signal supplied to the gate of the transfer transistor Tx can be set to a voltage that is different from the other drive signals, without any additional diffusion layers. The same effect can be obtained also for the second reset transistor RST2.

(6) The first reset transistor RST1 is provided in the first semiconductor substrate 7 to reset the electric charge accumulated in the floating diffusion FD in response to the first reset signal. The first reset signal supply unit 307*b* is provided in the first semiconductor substrate 7, instead of the second semiconductor substrate 8, and supplies the first reset transistor RST1 with either the ground voltage or the voltage VDD higher than the ground voltage as the first reset signal. In this way, the variation range of the signal voltage of the transfer signal includes an negative voltage, while the variation range of the signal voltage of the first reset signal may be a regular range including no negative voltage.

(7) The ground voltage, which is one of the voltages (i.e., the ground voltage and the voltage VDD) of the first reset signal, is a voltage based on the substrate voltage of the first semiconductor substrate 7. This eliminates the need for an additional diffusion layer for providing the first reset signal supply unit 307*b*.

(8) The A/D conversion unit 302 and the sampling unit 303 perform an analog/digital conversion on the analog signal based on the amount of the electric charge accumulated in the floating diffusion FD, by the correlated multiplex sampling process. In this way, the S/N ratio of the image-capturing signal is enhanced.

(9) The second reset transistor RST2 is provided to reset the electric charge accumulated in the photodiode 31. In this way, the exposure time can vary for different pixels 30.

(10) The image sensor 3 includes a plurality of the pixels 30 each including the photodiode 31, the floating diffusion FD, the transfer transistor Tx, and the transfer signal supply unit 307*a*. Each of the transfer signal supply units 307*a* included in some of a plurality of the pixels 30 supplies a transfer signal that transfers the electric charge generated by the photodiode 31 during the first period to the floating diffusion FD. Each of the transfer signal supply units 307*a* included in others of a plurality of the pixels 30 supplies a transfer signal that transfers the electric charge generated by the photodiode 31 during the second period to the floating diffusion FD, the second period having a length different from that of the first period. This enables the exposure time to individually vary for different pixels 30, which results in an extended dynamic range of the image sensor 3.

In the first embodiment described above, the second semiconductor substrate 8 includes both a pMOS transistor Tr6 (the first power supply unit) for supplying the voltage VTxH corresponding to the high level of the transfer signal, and an nMOS transistor Tr4 and an nMOS transistor Tr5 (the second power supply unit) for supplying the voltage VTxL corresponding to the low level of the transfer signal, as illustrated in FIG. 5. However, only one of them may be provided in the second semiconductor substrate 8 and the other may be provided in the first semiconductor substrate 7. In this case, it is preferable to provide the nMOS transistor Tr4 and the nMOS transistor Tr5 (the second power supply unit) having a larger area in the second semiconductor substrate 8, and provide the pMOS transistor Tr6 (the first power supply unit) having a smaller area in the first semiconductor substrate 7.

Figure 10:
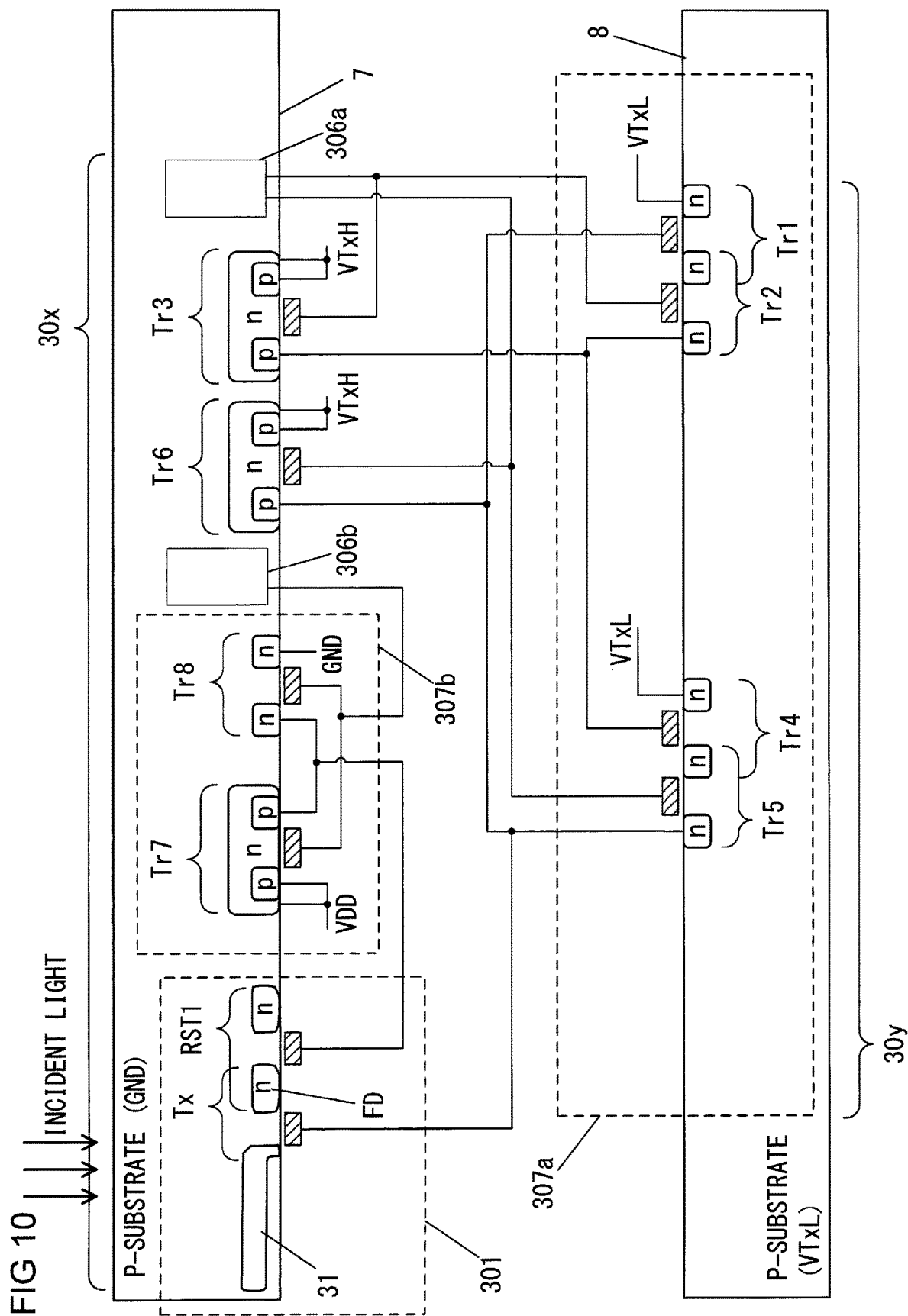
FIG. 10 is a view schematically illustrating a well structure of the first semiconductor substrate and the second semiconductor substrate.

FIG. 10 is a view illustrating an example in which the pMOS transistor Tr6 (the first power supply unit) is provided in the first semiconductor substrate 7. The example illustrated in FIG. 10 provides not only the pMOS transistor Tr6 (the first power supply unit), but also the pMOS transistor Tr3 in the first semiconductor substrate 7. In the configuration illustrated in FIG. 10, the circuit configuration and operation are the same as those in the first embodiment described above.

Second Embodiment

The image sensor 3 according to the first embodiment has the first semiconductor substrate 7 and the second semiconductor substrate 8. An image sensor 3 according to a second embodiment further includes a third semiconductor substrate 9. The following description describes the image sensor 3 according to the second embodiment and mainly differences from the image sensor 3 according to the first embodiment. The same components as those of the first embodiment are denoted by the same reference numerals and the description thereof will be omitted herein.

Figure 7:
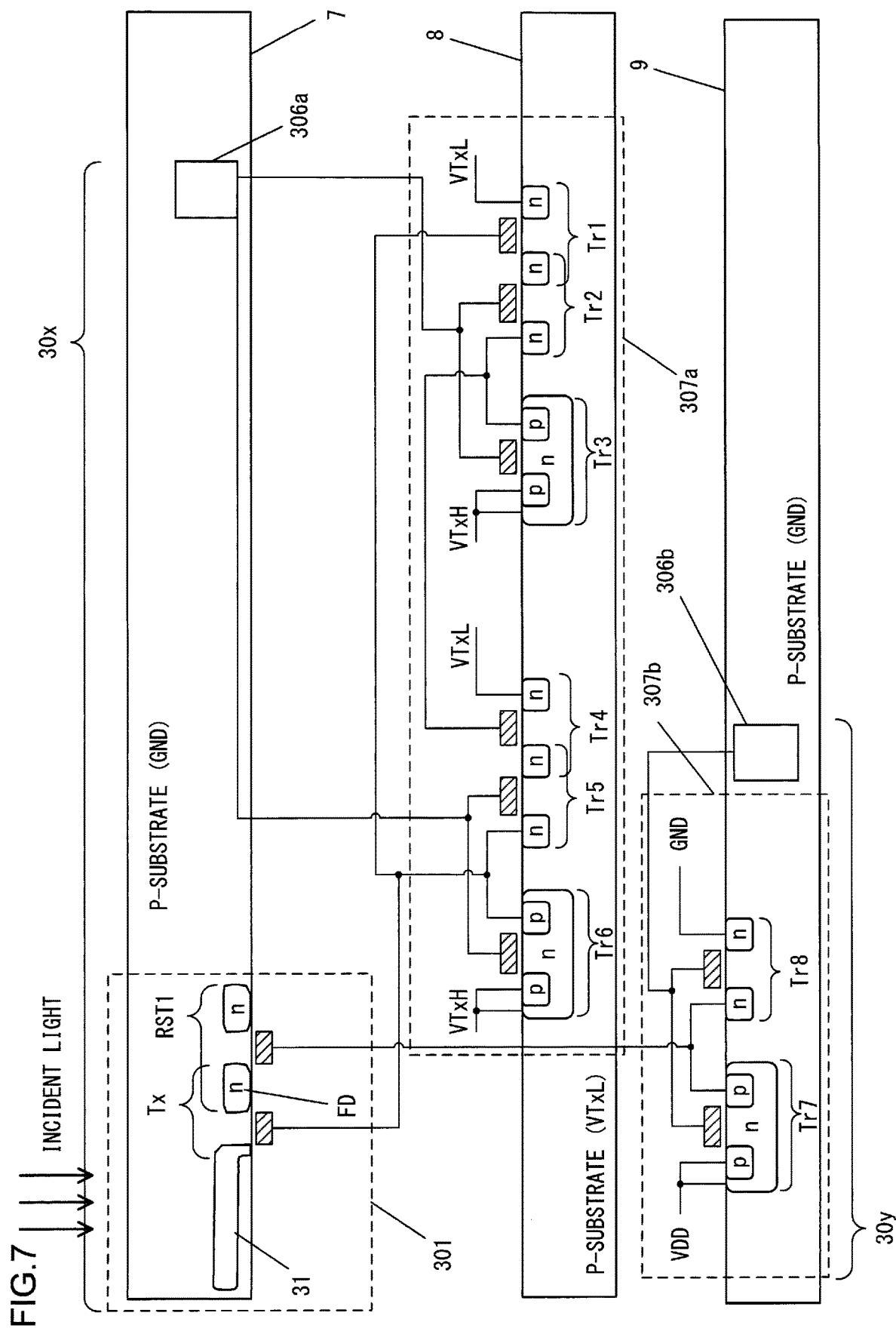
FIG. 7 is a view schematically illustrating a well structure of the first semiconductor substrate, the second semiconductor substrate, and a third semiconductor substrate.

FIG. 7 is a view schematically illustrating a well structure of the first semiconductor substrate 7, the second semiconductor substrate 8, and the third semiconductor substrate 9. In the present embodiment, the first semiconductor substrate 7 is not provided with the first reset control unit 306*b* and the first reset signal supply unit 307*b*. Instead, the third semiconductor substrate 9 is provided with the first reset control unit 306*b* and the first reset signal supply unit 307*b*. The third semiconductor substrate 9 is a P-type semiconductor substrate having a substrate voltage that is set to the ground voltage.

According to the above embodiment, the following operational advantages can further be obtained, in addition to the operational advantages described in the first embodiment.

(11) The image sensor 3 further includes the third semiconductor substrate 9 having the same substrate voltage (the ground voltage) as that of the first semiconductor substrate 7. The first reset signal supply unit 307*b* is provided in the third semiconductor substrate 9. In this way, the number of circuits occupying the first semiconductor substrate 7 is smaller than that in the first embodiment, so that the opening of the photodiode 31 can be increased. In other words, the light use efficiency of the photodiode 31 is further improved.

In the second embodiment described above, the second semiconductor substrate 8 includes both an nMOS transistor Tr6 (the first power supply unit) for supplying the voltage VTxH corresponding to the high level of the transfer signal, and a pMOS transistor Tr4 and a pMOS transistor Tr5 (the second power supply unit) for supplying the voltage VTxL corresponding to the low level of the transfer signal, as illustrated in FIG. 7. However, only one of them may be provided in the second semiconductor substrate 8 and the other may be provided in the first semiconductor substrate 7. In this case, it is preferable to provide the pMOS transistor Tr4 and the pMOS transistor Tr5 (the second power supply unit) having a larger area in the second semiconductor substrate 8, and provide the nMOS transistor Tr6 (the first power supply unit) having a smaller area in the first semiconductor substrate 7.

In the second embodiment described above, the pMOS transistor Tr1, the pMOS transistor Tr2, the nMOS transistor Tr3, the pMOS transistor Tr4, the pMOS transistor Tr5, and the nMOS transistor Tr6, which are included in the transfer signal supply unit 307*a*, are all provided in the second semiconductor substrate 8, as illustrated in FIG. 7. Some of these transistors may be provided in the first semiconductor substrate 7 or the third semiconductor substrate 9.

Third Embodiment

The image sensor 3 according to the first embodiment has the second semiconductor substrate 8 configured as a P-type semiconductor substrate. An image sensor 3 according to a third embodiment has a second semiconductor substrate 8 configured as an N-type semiconductor substrate. The following description describes the image sensor 3 according to the third embodiment and mainly differences from the image sensor 3 according to the first embodiment. The same components as those of the first embodiment are denoted by the same reference numerals and the description thereof will be omitted herein.

Figure 8:
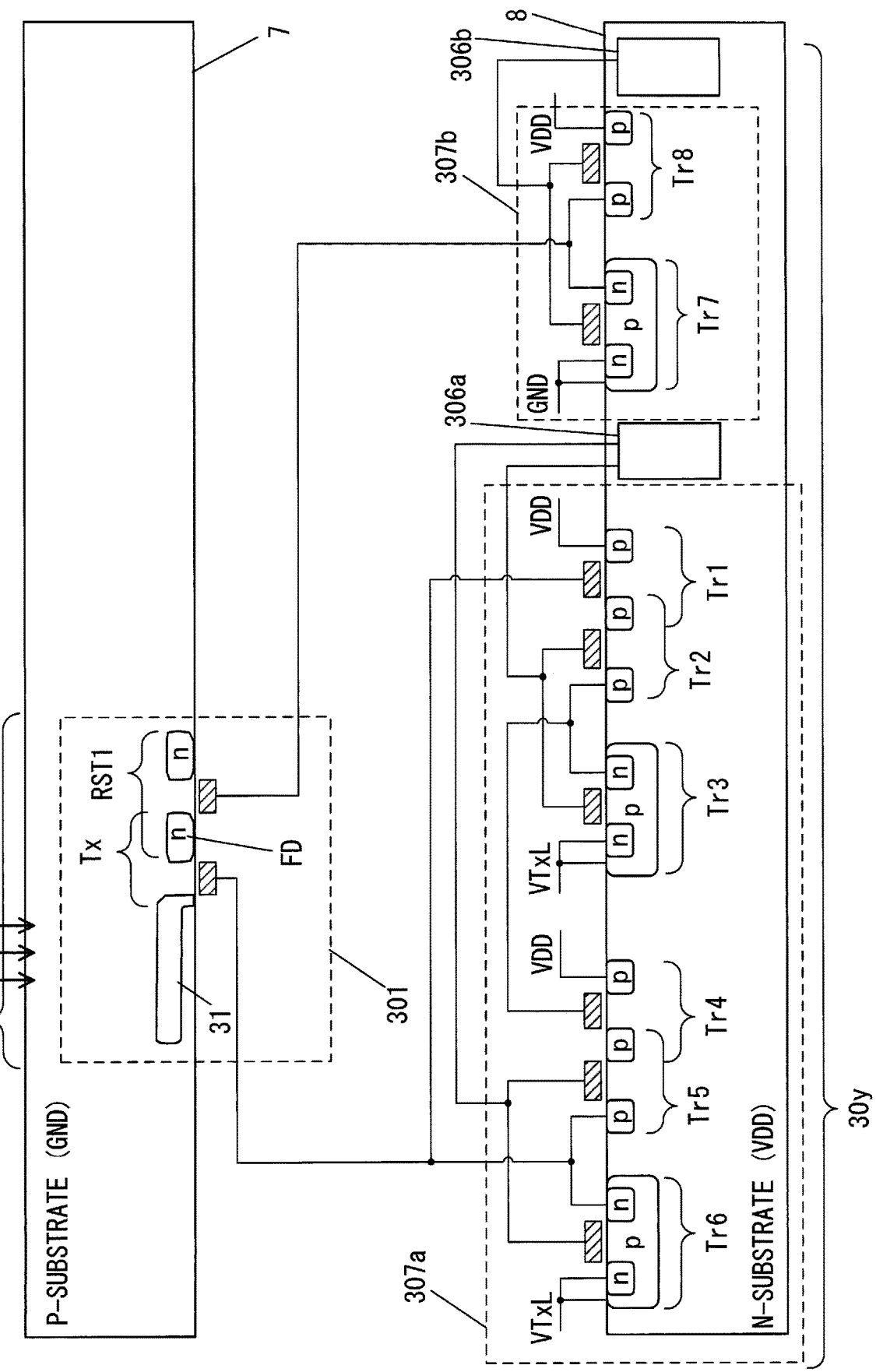
FIG. 8 is a view schematically illustrating a well structure of the first semiconductor substrate and the second semiconductor substrate.

FIG. 8 is a view schematically illustrating a well structure of the first semiconductor substrate 7 and the second semiconductor substrate 8. The second semiconductor substrate 8 is an N-type semiconductor substrate having a substrate voltage that is set to a voltage corresponding to the voltage VDD. In the present embodiment, the first semiconductor substrate 7 is not provided with the transfer control unit 306a, the first reset control unit 306b, the transfer signal supply unit 307a, and the first reset signal supply unit 307b. Instead, the second semiconductor substrate 8 is provided with the transfer control unit 306a, the first reset control unit 306b, the transfer signal supply unit 307a, and the first reset signal supply unit 307b. Although not illustrated in FIG. 8, it is desirable to also arrange other components of the individual pixel control unit 306 and the pixel driving unit 307 in the second semiconductor substrate 8.

The transfer control unit 306a, the first reset control unit 306b, the transfer signal supply unit 307a, and the first reset signal supply unit 307b have the same configuration as in the first embodiment, but the polarity of the diffusion layer is different from that in the first embodiment since the second semiconductor substrate 8 is an N-type semiconductor substrate. Accordingly, for the transistors constituting the components, the nMOS transistors in the first embodiment are replaced by pMOS transistors and the pMOS transistors in the first embodiment are replaced by nMOS transistors.

The transfer signal supply unit 307a in the present embodiment supplies the gate of the transfer transistor Tx with either the voltage VDD or the voltage VTxL as the transfer signal, based on the output signal of the transfer control unit 306a. Since the substrate voltage of the second semiconductor substrate 8 is a voltage corresponding to the voltage VDD, an increase in circuit scale (an addition of a further diffusion layer or the like) can be avoided by using the voltage VDD, instead of the voltage VTxH.

According to the above embodiment, the following operational advantages can further be obtained, in addition to the operational advantages described in the first embodiment.

(12) The second semiconductor substrate 8 is configured as an N-type semiconductor substrate and provided with the individual pixel control unit 306 and the pixel driving unit 307. In this way, the number of circuits occupying the first semiconductor substrate 7 is smaller than that in the first or second embodiment, so that the opening of the photodiode 31 can be increased. In other words, the light use efficiency of the photodiode 31 is further improved. Further, unlike the second embodiment, no additional semiconductor substrate is required. A material cost can thus be reduced and an increase in thickness of the image sensor 3 can be minimized.

In the third embodiment described above, the second semiconductor substrate 8 includes both an nMOS transistor Tr6 (the first power supply unit) for supplying the voltage VTxH corresponding to the high level of the transfer signal, and a pMOS transistor Tr4 and a pMOS transistor Tr5 (the second power supply unit) for supplying the voltage VTxL corresponding to the low level of the transfer signal, as illustrated in FIG. 8. However, only one of them may be provided in the second semiconductor substrate 8 and the other may be provided in the first semiconductor substrate 7. In this case, it is preferable to provide the pMOS transistor Tr4 and the pMOS transistor Tr5 (the second power supply unit) having a larger area in the second semiconductor substrate 8, and provide the nMOS transistor Tr6 (the first power supply unit) having a smaller area in the first semiconductor substrate 7.

Fourth Embodiment

An image sensor 3 according to a fourth embodiment has an individual pixel control unit 306 and a pixel driving unit 307 provided in a second semiconductor substrate 8, as is the image sensor 3 according to the third embodiment. However, the fourth embodiment is different from the third embodiment in that the second semiconductor substrate 8 is configured as a P-type semiconductor substrate. The following description describes the image sensor 3 according to the third embodiment and mainly differences from the image sensor 3 according to the first embodiment. The same components as those of the first embodiment are denoted by the same reference numerals and the description thereof will be omitted herein.

Figure 9:
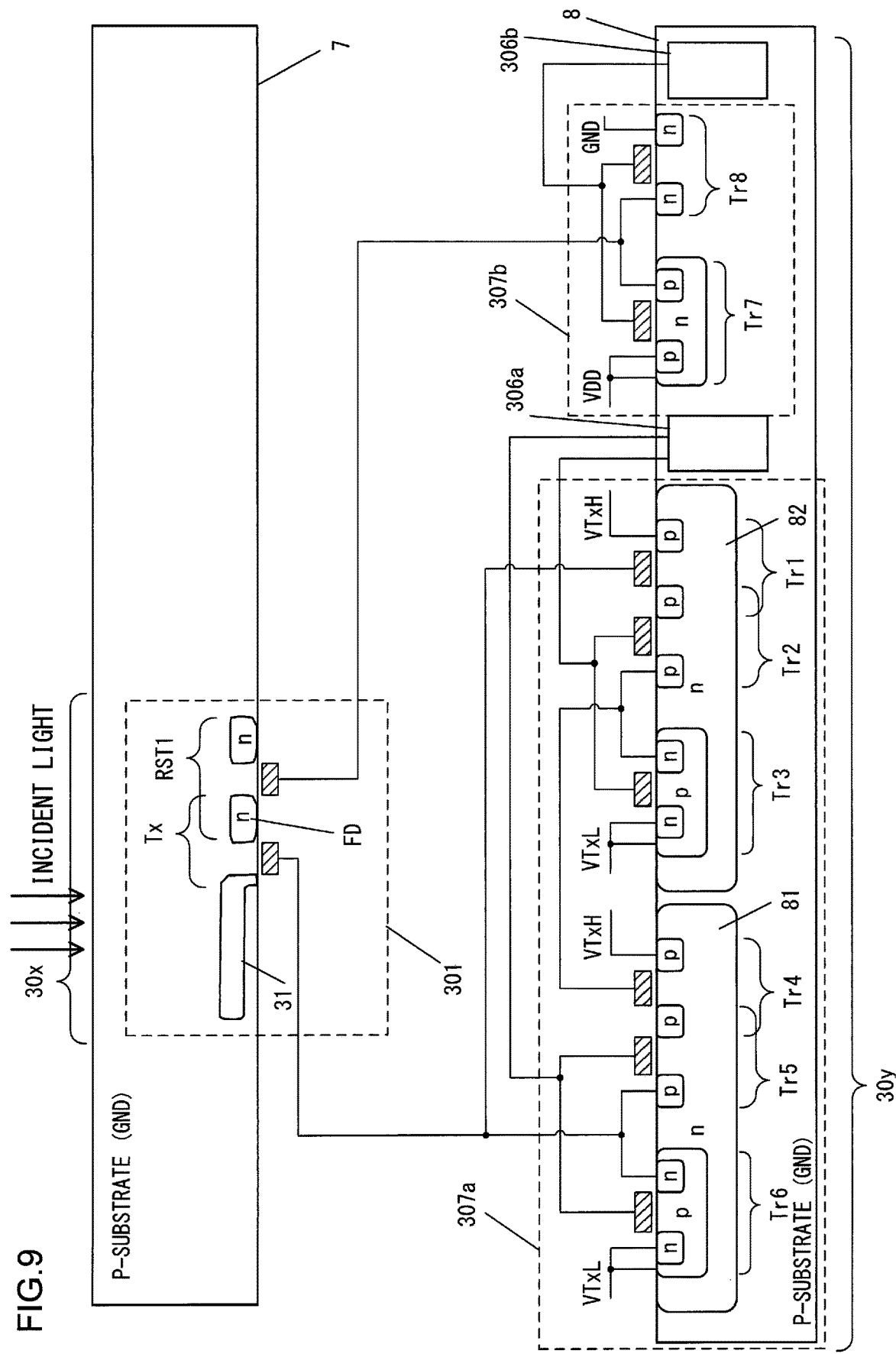
FIG. 9 is a view schematically illustrating a well structure of the first semiconductor substrate and the second semiconductor substrate.

FIG. 9 is a view schematically illustrating a well structure of the first semiconductor substrate 7 and the second semiconductor substrate 8. The second semiconductor substrate 8 is a P-type semiconductor substrate and has a substrate voltage that is set to the ground voltage, as is the first semiconductor substrate 7.

In the present embodiment, N-type diffusion layers 81 and 82 are provided in the second semiconductor substrate 8 for the purpose of providing the transfer signal supply unit 307a, which handles the voltage VTxH and the voltage VTxL, in the second semiconductor substrate 8. A transfer signal supply unit 307a is arranged in the diffusion layers 81 and 82, in which the nMOS transistors in the first embodiment are replaced by pMOS transistors and the pMOS transistor in the first embodiment are replaced by nMOS transistors as in the third embodiment. Since the N-type diffusion layers 81 and 82 electrically separate the transistors from the P-type substrate, the transfer signal supply unit 307a can handle the voltage VTxH and the voltage VTxL.

According to the above embodiment, the following operational advantages can be obtained.

(13) The photodiode 31 photoelectrically converts incident light. The transfer transistor Tx transfers the electric charge as a result of the photoelectric conversion by the photodiode 31 to the floating diffusion FD in response to the transfer signal. The transfer signal supply unit 307a supplies the gate of the transfer transistor Tx with the transfer signal. The first reset transistor RST1 resets the electric charge accumulated in the floating diffusion FD in response to the first reset signal. The first reset signal supply unit 307b supplies the first reset transistor RST1 with the reset signal. The photodiode 31 and the transfer transistor Tx are provided in the first semiconductor substrate 7. The second semiconductor substrate 8 is provided with the first reset signal supply unit 307b arranged in the N-type diffusion layer and the transfer signal supply unit 307a arranged in the P-type diffusion layer. In this way, the number of circuits occupying the first semiconductor substrate 7 is smaller than that in the first or second embodiment, so that the opening of the photodiode 31 can be increased as in the third embodiment. In other words, the light use efficiency of the photodiode 31 is further improved. Further, unlike the second embodiment, no additional semiconductor substrate is required. A material cost can thus be reduced and an increase in thickness of the image sensor 3 can be minimized.

In the first embodiment described above, the second semiconductor substrate 8 includes both an nMOS transistor Tr6 (the first power supply unit) for supplying the voltage VTxH corresponding to the high level of the transfer signal, and a pMOS transistor Tr4 and a pMOS transistor Tr5 (the second power supply unit) for supplying the voltage VTxL corresponding to the low level of the transfer signal, as illustrated in FIG. 9. However, only one of them may be provided in the second semiconductor substrate 8 and the other may be provided in the first semiconductor substrate 7. In this case, it is preferable to provide the pMOS transistor Tr4 and the pMOS transistor Tr5 (the second power supply unit) having a larger area in the second semiconductor substrate 8, and provide the nMOS transistor Tr6 (the first power supply unit) having a smaller area in the first semiconductor substrate 7.

Figure 11:
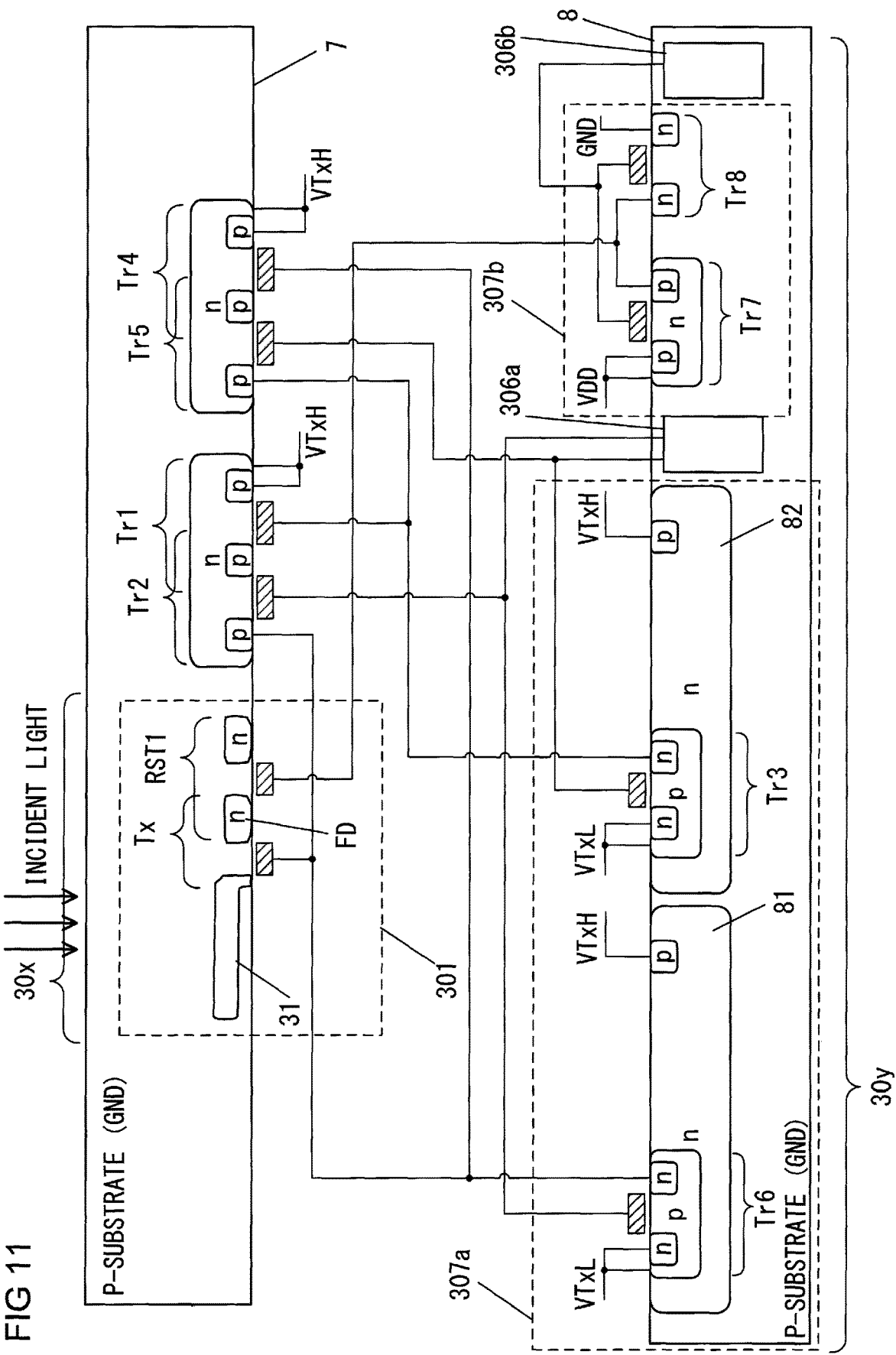
FIG. 11 is a view schematically illustrating a well structure of the first semiconductor substrate and the second semiconductor substrate.

FIG. 11 is a view illustrating an example in which the pMOS transistor Tr4 and the pMOS transistor Tr5 (second power supply unit) are provided in the first semiconductor substrate 7. The example illustrated in FIG. 11 provides not only the pMOS transistor Tr4 and the pMOS transistor Tr5 (the second power supply unit), but also the pMOS transistor Tr1 and the pMOS transistor Tr2 in the first semiconductor substrate 7. In the configuration illustrated in FIG. 11, the circuit configuration and operation are the same as those in the fourth embodiment described above.

The following variations are also contemplated within the scope of the present invention, and one or more variations may be combined with the above embodiments.

First Variation

Circuits different from the circuits described in the above embodiments may be provided in the second semiconductor substrate 8 or the third semiconductor substrate 9. For example, the circuits that are mounted in the first semiconductor substrate 7 in the above embodiments may be provided in the second semiconductor substrate 8 or the third semiconductor substrate 9. This can form a larger space for the photodiode 31 to more efficiently capture light.

While various embodiments and variations have been described above, the present invention is not limited to these. Other embodiments contemplated within the technical idea of the present invention are also included within the scope of the present invention.

The above embodiments and variations also include the following image-capturing apparatus and electronic camera.

(1) An image sensor comprising: a first semiconductor substrate provided with a pixel, including a photoelectric conversion unit that photoelectrically converts incident light to generate an electric charge, an accumulation unit that accumulates the electric charge generated by the photoelectric conversion unit, and a transfer unit that transfers the electric charge generated by the photoelectric conversion unit to the accumulation unit; and a second semiconductor substrate provided with a supply unit for the pixel, the supply unit supplying the transfer unit with a transfer signal to transfer the electric charge from the photoelectric conversion unit to the accumulation unit.

(2) In the image sensor as described in (1), a first substrate voltage applied to the first semiconductor substrate and a second substrate voltage applied to the second semiconductor substrate are different from each other.

(3) In the image sensor as described in (2), the supply unit includes a first power supply unit and a second power supply unit; and at least one of the first power supply unit and the second power supply unit is provided in the second semiconductor substrate.

(4) In the image sensor as described in (3), the first power supply unit supplies a first voltage higher than the first substrate voltage; and the second power supply unit supplies a second voltage lower than the first substrate voltage.

(5) In the image sensor as described in (4), the transfer unit electrically connects the photoelectric conversion unit and the accumulation unit and transfers the electric charge generated by the photoelectric conversion unit to the accumulation unit; and the supply unit supplies the transfer unit with the transfer signal for electrically connecting or disconnecting the photoelectric conversion unit and the accumulation unit.

(6) In the image sensor as described in (5), the transfer unit electrically connects the photoelectric conversion unit and the accumulation unit if the first voltage is supplied as the transfer signal, and electrically disconnects the photoelectric conversion unit and the accumulation unit if the second voltage is supplied as the transfer signal.

(7) In the image sensor as described in (4) to (6), the supply unit supplies the transfer signal for transferring the electric charge generated by the photoelectric conversion unit during a first period to the accumulation unit or the transfer signal for transferring the electric charge generated by the photoelectric conversion unit during a second period to the accumulation unit, the second period having a length different from that of the first period.

(8) In the image sensor as described in (7), an end time of the first period is the same as an end time of the second period.

(9) In the image sensor as described in (4) to (8), one of the first voltage and the second voltage is the second substrate voltage.

(10) The image sensor as described in (4) or (5) further comprises: a first reset unit that is provided in the first semiconductor substrate and resets an electrical charge accumulated in the accumulation unit based on a reset signal; a reset signal supply unit that is provided in a semiconductor substrate different from the second semiconductor substrate and supplies the first reset unit with either a third voltage not less than the first substrate or a fourth voltage higher than the third voltage as the reset signal.

(11) In the image sensor as described in (10), one of the third voltage and the fourth voltage is the first substrate voltage.

(12) The image sensor as described in (10) further comprises: a third semiconductor substrate to which the first substrate voltage is applied, wherein: the reset signal supply unit is provided in the third semiconductor substrate.

(13) In the image sensor as described in (1) to (6), comprises: a plurality of the pixels, wherein: the supply unit included in one of a plurality of the pixels supplies the transfer signal that transfers the electric charge generated by the photoelectric conversion unit during a first period to the accumulation unit and the supply unit included in others of a plurality of the pixels supplies the transfer signal that transfers the electric charge generated by the photoelectric conversion unit during a second period to the accumulation unit, the second period having a length different from that of the first period.

(14) An image sensor comprising: a photoelectric conversion unit that photoelectrically converts incident light to generate an electric charge; a transfer unit that transfers an electric charge generated by the photoelectric conversion unit to an accumulation unit based on a transfer signal; a transfer signal supply unit that supplies the transfer unit with the transfer signal; a first reset unit that resets the electric charge accumulated in the accumulation unit based on a reset signal; a reset signal supply unit that supplies the first reset unit with the reset signal, a first semiconductor substrate provided with the photoelectric conversion unit, the transfer unit, and the first reset unit; and a second semiconductor substrate provided with the reset signal supply unit arranged in a first diffusion layer and the transfer signal supply unit arranged in a second diffusion layer having a polarity different from that of the first diffusion layer.

(15) The image sensor as described in (1) to (14) further comprises: an A/D conversion unit that performs an analog/digital conversion on an analog signal based on an amount of electric charge accumulated in the accumulation unit, by a correlated multiplex sampling process.

(16) The image sensor as described in (1) to (15) further comprises: a second reset unit that resets the electric charge accumulated in the photoelectric conversion unit.

(17) In the image sensor as described in (1) to (16), the photoelectric conversion unit is a pinned photodiode.

(18) An electronic camera comprising the image sensor as described in (1) to (16).

The above-described embodiments and variations further include the following image sensors.

(1) An image sensor comprising: a first semiconductor substrate provided with a photoelectric conversion unit that photoelectrically converts incident light and a transfer unit that transfers an electric charge generated by the photoelectric conversion unit to an accumulation unit based on a transfer signal; and a second semiconductor substrate provided with a transfer signal supply unit that supplies either one of a first voltage lower than a ground voltage and a second voltage higher than the ground voltage as the transfer signal to the transfer unit.

(2) In the image sensor as described in (1), the first semiconductor substrate has a plurality of the photoelectric conversion units, a plurality of the accumulation units, and a plurality of the transfer units; and the second semiconductor substrate has a plurality of the transfer signal supply units, wherein: some of a plurality of the transfer signal supply units transfer the electric charge generated by the photoelectric conversion unit during a first period to the accumulation unit and others of a plurality of the transfer signal supply units transfer the electric charge generated by the photoelectric conversion unit during a second period to the accumulation unit, the second period having a length different from that of the first period.

(3) In the image sensor as described in (2), an end time of the first period is the same as an end time of the second period.

(4) In the image sensor as described in (1) to (3), a first substrate voltage at the first semiconductor substrate is different from second substrate voltage at the second semiconductor substrate.

(5) In the image sensor as described in (4), one of the first voltage and the second voltage is a voltage based on the second substrate voltage.

(6) The image sensor as described in (4) or (5) further comprises: a first reset unit that is provided in the first semiconductor substrate and resets an electrical charge accumulated in the accumulation unit in response to a reset signal; a reset signal supply unit that is provided in a semiconductor substrate different from the second semiconductor substrate and supplies the first reset unit with either a third voltage not less than a ground voltage or a fourth voltage higher than the third voltage as the reset signal.

(7) In the image sensor as described in (6), one of the third voltage and the fourth voltage is a voltage based on the first substrate voltage.

(8) The image sensor as described in (6) further comprises: a third semiconductor substrate for which the first substrate voltage is set, wherein: the reset signal supply unit is provided in the third semiconductor substrate.

(9) The image sensor as described in (1) comprises a plurality of pixels, each including the photoelectric conversion unit, the accumulation unit, the transfer unit, and the transfer signal supply unit, wherein each of the transfer signal supply units included in some of a plurality of the pixels supplies the transfer signal that transfers the electric charge generated by the photoelectric conversion unit during a first period to the accumulation unit and each of the transfer signal supply units included in others of a plurality of the pixels supplies the transfer signal that transfers the electric charge generated by the photoelectric conversion unit during a second period to the accumulation unit, the second period having a length different from that of the first period.

(10) An image sensor comprising: a photoelectric conversion unit that photoelectrically converts incident light; a transfer unit that transfers an electric charge photoelectrically converted by the photoelectric conversion unit to an accumulation unit in response to a transfer signal; a transfer signal supply unit that supplies the transfer unit with the transfer signal; a first reset unit that resets the electric charge accumulated in the accumulation unit in response to a reset signal; a reset signal supply unit that supplies the first reset unit with the reset signal; a first semiconductor substrate provided with the photoelectric conversion unit, the transfer unit, and the first reset unit; and a second semiconductor substrate provided with the reset signal supply unit arranged in a first diffusion layer and the transfer signal supply unit arranged in a second diffusion layer having a polarity different from that of the first diffusion layer.

(11) The image sensor as described in (1) to (10) further comprises: an A/D conversion unit that performs an analog/digital conversion on an analog signal based on an amount of electric charge accumulated in the accumulation unit, by a correlated multiplex sampling process.

(12) The image sensor as described in (1) to (11) further comprises: a second reset unit that resets the electric charge accumulated in the photoelectric conversion unit.

(13) In the image sensor as described in (1) to (12), the photoelectric conversion unit is a pinned photodiode.

The disclosure of the following priority application is herein incorporated by reference:

Japanese Patent Application No. 2015-195280 (filed Sep. 30, 2015)

REFERENCE SIGNS LIST

3 . . . image sensor, 7 . . . first semiconductor substrate, 8 . . . second semiconductor substrate, 30 . . . pixel, 31 . . . photodiode, 301 . . . analog circuit unit 302 . . . A/D conversion unit, 303 . . . sampling unit, 306 . . . individual pixel control unit, 307 . . . pixel driving unit

The invention claimed is:

1. An image sensor comprising:
a first semiconductor substrate on which a first pixel and a second pixel that are arranged in a row direction are provided, each of the first pixel and the second pixel having: a photoelectric conversion unit that photoelectrically converts light and generates an electric charge; and a transfer unit that transfers the electric charge generated by the photoelectric conversion unit to an accumulation unit; and
a second semiconductor substrate including: a first supply unit that supplies a voltage equal to or higher than a first voltage to the transfer unit so as to transfer the electric charge to the accumulation unit of the first pixel, and supplies a voltage lower than the first voltage to the transfer unit so as not to transfer the electric charge to the accumulation unit of the first pixel; and a second supply unit that supplies a voltage equal to or higher than the first voltage to the transfer unit so as to transfer the electric charge to the accumulation unit of the second pixel, and supplies a voltage lower than the first voltage to the transfer unit so as not to transfer the electric charge to the accumulation unit of the second pixel.

2. The image sensor according to claim 1, further comprising:
a first control unit that controls the first supply unit, and a second control unit that controls the second supply unit which are arranged in the row direction.

3. The image sensor according to claim 2, wherein the first and second control units are provided on the first substrate.

4. The image sensor according to claim 2, wherein the first and second control units are provided on the second substrate.

5. The image sensor according to claim 1, wherein the transfer unit electrically connects the photoelectric conversion unit and the accumulation unit if a voltage equal to or higher than the first voltage is supplied, and electrically disconnects the photoelectric conversion unit and the accumulation unit if a voltage lower than the first voltage is supplied.

6. The image sensor according to claim 1, wherein each of the first pixel and the second pixel includes a first reset unit that resets the electric charge generated by the photoelectric conversion unit,
the first supply unit supplies a voltage equal to or higher than the first voltage to the first reset unit of the first pixel so as to reset the electric charge generated by the photoelectric conversion unit of the first pixel, and
the second supply unit supplies a voltage equal to or higher than the first voltage to the first reset unit of the second pixel so as to reset the electric charge generated by the photoelectric conversion unit of the second pixel.

7. The image sensor according to claim 1, wherein each of the first pixel and the second pixel includes a second reset unit that resets the electric charge accumulated in the accumulation unit,
the first supply unit supplies a voltage equal to or higher than the first voltage to the second reset unit of the first pixel so as to reset the electric charge accumulated in the accumulation unit of the first pixel, and
the second supply unit supplies a voltage equal to or higher than the first voltage to the second reset unit of the second pixel so as to reset the electric charge accumulated in the accumulation unit of the second pixel.

8. The image sensor according to claim 1, wherein the transfer unit of the first pixel transfers, to the accumulation unit, the electric charge generated by the photoelectric conversion unit in a first period, and
the transfer unit of the second pixel transfers, to the accumulation unit, the electric charge generated by the photoelectric conversion unit in a second period having a length different from a length of the first period.

9. The image sensor according to claim 1, wherein the first supply unit supplies a voltage to the transfer unit of the first pixel so as to transfer, to the accumulation unit, the electric charge generated by the photoelectric conversion unit in a first period, and
the second supply unit supplies a voltage to the transfer unit of the second pixel so as to transfer, to the accumulation unit, the electric charge generated by the photoelectric conversion unit in a second period having a length different from a length of the first period.

10. The image sensor according to claim 1, wherein the first voltage is applied to the first semiconductor substrate.

11. The image sensor according to claim 1, wherein a second voltage different from the first voltage is applied to the second semiconductor substrate.

12. The image sensor according to claim 1, wherein a voltage lower than the first voltage is applied to the second semiconductor substrate.

13. The image sensor according to claim 1, wherein the supply unit includes at least one of a first power supply unit and a second power supply unit provided on the second semiconductor substrate.

14. The image sensor according to claim 13, wherein the first power supply unit supplies a voltage equal to or higher than the first voltage; and
the second power supply unit supplies a voltage lower than the first voltage.

15. The image sensor according to claim 1, wherein the first voltage is a ground voltage.

16. The image sensor according to claim 1, further comprising:
an A/D conversion unit that is provided on the second semiconductor substrate and converts an analog signal based on the electric charge accumulated in the accumulation unit into a digital signal.

17. The image sensor according to claim 16, wherein the A/D conversion unit is provided for each of the photoelectric conversion units.

18. An image-capturing apparatus comprising:
the image sensor according to claim 1.

* * * * *